(12) United States Patent
Yeo et al.

(10) Patent No.: US 8,786,298 B2
(45) Date of Patent: Jul. 22, 2014

(54) APPARATUS AND METHOD FOR NEAR FIELD SCAN CALIBRATION

(75) Inventors: Soon Il Yeo, Daejeon (KR); Jae Kyung Wee, Seoul (KR); Pil Soo Lee, Gyeonggi-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 350 days.

(21) Appl. No.: 13/323,842

(22) Filed: Dec. 13, 2011

(65) Prior Publication Data

US 2012/0161803 A1    Jun. 28, 2012

(30) Foreign Application Priority Data

Dec. 22, 2010 (KR) .................. 10-2010-0132245

(51) Int. Cl.
  *G01R 31/00* (2006.01)
  *G01R 35/00* (2006.01)
  *G01R 29/08* (2006.01)
(52) U.S. Cl.
  CPC ............ *G01R 35/00* (2013.01); *G01R 29/0892* (2013.01); *G01R 29/0814* (2013.01)
  USPC .................................. 324/750.02; 324/754.29
(58) Field of Classification Search
  None
  See application file for complete search history.

(56) References Cited

U.S. PATENT DOCUMENTS

| | | | |
|---|---|---|---|
| 6,281,697 B1 * | 8/2001 | Masuda et al. ........... | 324/754.29 |
| 7,358,749 B2 * | 4/2008 | Kazama et al. .......... | 324/754.27 |
| 7,595,650 B2 * | 9/2009 | Funato et al. ............ | 324/754.29 |
| 2008/0316123 A1 * | 12/2008 | Kajiwara et al. .............. | 343/703 |

FOREIGN PATENT DOCUMENTS

| | | |
|---|---|---|
| EP | 1 973 192 A1 | 9/2008 |
| KR | 2004-0049154 A | 6/2004 |
| KR | 2010-0109151 A | 10/2010 |

OTHER PUBLICATIONS

Sang-Mi Chon et al., "Developement of Planar Active Array Antenna System for Radar", Journal of the Korean Institute of Electromagnetic Engineering and Science, vol. 20, No. 12, pp. 1340-1350, Dec. 2009.

* cited by examiner

*Primary Examiner* — Minh N Tang
(74) *Attorney, Agent, or Firm* — Rabin & Berdo, P.C.

(57) ABSTRACT

Disclosed are a method and an apparatus of near field scan calibration, and more particularly, a method and an apparatus for near field scan calibration for calibrating a characteristic of an antenna for near field scan measurement of a semiconductor chip. The apparatus for near field scan calibration includes: a plane-type text fixture having a plane shape; an antenna positioned spaced apart from the plane-type test fixture by a set spacing distance and acquiring data including a magnetic field; and a spectrum analyzer analyzing the data acquired by the antenna.

12 Claims, 4 Drawing Sheets

(RELATED ART)

APPARATUS AND METHOD FOR NEAR FIELD SCAN CALIBRATION

CROSS-REFERENCE TO RELATED APPLICATIONS

This application is based on and claims priority from Korean Patent Application No. 10-2010-0132245, filed on Dec. 22, 2010, with the Korean Intellectual Property Office, the present disclosure of which is incorporated herein in its entirety by reference.

TECHNICAL FIELD

The present disclosure relates to a method and an apparatus of near field scan calibration. More particularly, the present disclosure relates to a method and an apparatus for near field scan calibration for calibrating a characteristic of an antenna for near field scan measurement of a semiconductor chip.

BACKGROUND

In general, it is needed that electronic apparatuses operate normally under a given electromagnetic environment and do not negatively influence other systems by restricting electromagnetic interference generated from themselves. For this reason, irradiation of electromagnetic waves is extremely suppressed or excessive resistance to the electromagnetic interference is designed, which causes a large economical burden. Therefore, balancing both sides is required.

It is known that the electromagnetic waves influence human bodies and in some cases, cause cancers. The electromagnetic waves may cause malfunctions of electrical and electronic systems as well as a negative influence on the human bodies. The phenomenon is called electro magnetic compatibility (EMC).

The electro magnetic compatibility (EMC) means a phenomenon in which the electrical and electronic systems are influenced by the electromagnetic waves to cause erroneous operation or a disabling state and includes both electro magnetic interference (EMI) and electro magnetic susceptibility (EMS). Meanwhile, in recent years, a measurement scope of the EMC phenomenon has been extended from a PCB level in the related art to a semiconductor chip level mounted on a PCB. The resulting standardization related to EMC measurement of a semiconductor chip is executed by the IEC and the previously established standards include IEC61967 and IEC62132. The IEC61967 is related to electromagnetic emission and the IEC62132 is related to electromagnetic immunity. Meanwhile, the IEC61967.3 and 6 suggest calibration of an antenna characteristic to be used for measurement by using a microstrip line.

Since this is applied to a standard PCB and the width thereof is a narrow line of approximately 1 mm in detecting a magnetic field emitted from the entire semiconductor chip by connecting a power and signal line terminals to the microstrip line, it is difficult to calibrate an error depending on an angle or a location thereof in order to fabricate a probe for measuring the EMC.

SUMMARY

The present disclosure has been made in an effort to provide a method and an apparatus for calibrating a characteristic of a measurement antenna with a tendency in which near field scan of a semiconductor chip is increasingly required.

The present disclosure has been made in an effort to provide a method and an apparatus for calibrating an error depending on an angle or a location of a probe, which is generated by detecting a magnetic field emitted from the entire semiconductor chip by connecting an existing microstrip line.

An exemplary embodiment of the present disclosure provides an apparatus for near field scan calibration, including: a plane-type text fixture; an antenna positioned spaced apart from the plane-type test fixture by a set spacing distance and acquiring data including a magnetic field; and a spectrum analyzer analyzing the data acquired by the antenna.

The plane-type test fixture may have a circular shape.

The plane-type test fixture may have a polygonal shape including a triangular shape or a quadrangular shape.

The spacing distance between the plane-type test fixture and the antenna may be 1 mm.

The antenna may be set as a first port and the plane-type test fixture may be set as a second port.

The data acquired by the antenna may include the intensity of a spatial magnetic field generated vertically to the surface of the plane-type test fixture including a transmission coefficient and a reflection coefficient.

The magnetic field may be acquired by analyzing conducted emission (CE) transferred to a conductor.

The plane-type test fixture may be made of metal.

Another exemplary embodiment of the present disclosure provides a method for near field scan calibration, including: feeding power to the center of a plane-type test fixture; acquiring data including a magnetic field from an antenna spaced apart from the plane-type test fixture by a set spacing distance; and calibrating a characteristic of an antenna for near field scan measurement by using the data.

The plane-type test fixture may have a circular shape.

The plane-type test fixture may have a polygonal shape including a triangular shape or a quadrangular shape.

In the feeding of the power to the center of the plane-type test fixture, a plurality of plane-type test fixtures may be provided for each size and the power may be fed to each provided plane-type test fixture.

The spacing distance between the plane-type test fixture and the antenna may be 1 mm.

The antenna may be set as a first port and the plane-type test fixture may be set as a second port.

In the acquiring of the data, the intensity of a spatial magnetic field generated vertically generated on the surface of the plane-type test fixture including a transmission coefficient and a reflection coefficient may be acquired.

The magnetic field may be acquired by analyzing conducted emission (CE) transferred to a conductor.

According to the exemplary embodiments of the present disclosure, a standard calibration method is provided to perform near field scan measurement of a semiconductor chip directly with respect to the semiconductor chip, thereby conveniently and usefully performing the relevant measurement. That is, in the method using the micro strip line in the related art, the width is small, such that it is difficult to ensure calibration data for fabricating a probe, while in the present disclosure, the calibration data for fabricating the probe can be easily ensured by using a circular test fixture or a polygonal test fixture.

According to the exemplary embodiments of the present disclosure, since a standard probe can be fabricated, the standard probe can be usefully used in a near field scan measurement apparatus field.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
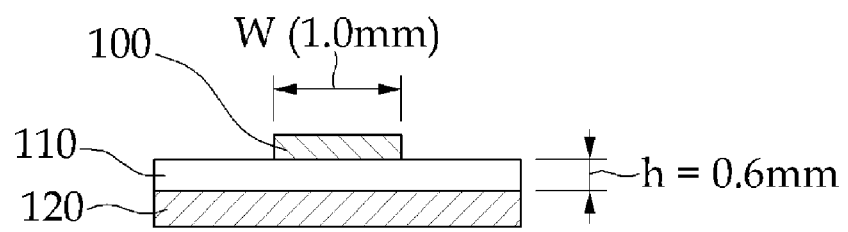
FIG. 1 is a diagram showing a cross-sectional structure of a microstrip line for calibration in the related art.

As described above, the IEC61967.3 and 6 suggest calibration of an antenna characteristic to be used for measurement by using a microstrip line. FIG. 1 is a diagram showing a cross-sectional structure of a micro strip line for calibration in the related art.

FIG. 1 shows a microstrip line for calibration described in 'Probe Calibration Procedure—Microstripline Method' stated in an annex of the IEC61967.6.

Referring to FIG. 1, the cross-sectional structure of a micro strip line 100 made of metal with a width of 1 mm and a length of 50 mm or longer is shown and micro strip line 100 is fabricated to have impedance (ZO) of 50 ohm.

More specifically, micro strip line 100 is spaced apart from a metallic ground 120 by approximately 0.6 mm with a dielectric 110 positioned in the middle thereof and a dielectric constant $\in_r$ of the dielectric is approximately 4.7. As described above, since the width of micro strip line 100 is approximately 1 mm, it is difficult to fabricate a probe for measuring EMC.

Figure 2:
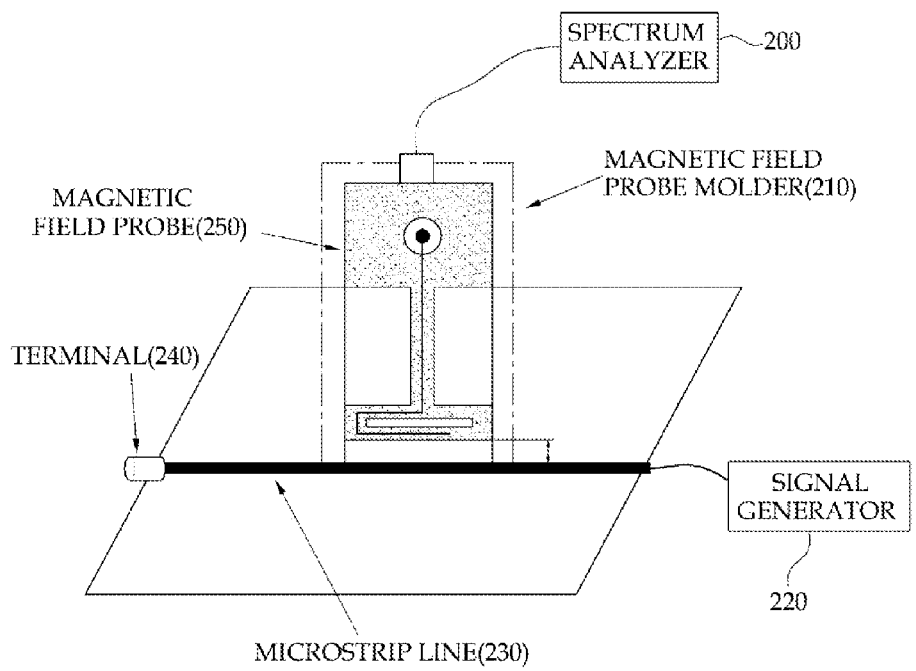
FIG. 2 is a diagram showing a cross-sectional structure of a microstrip line for calibration in the related art viewed from another angle.

FIG. 2 is a diagram showing a cross-sectional structure of a microstrip line for calibration in the related art viewed from another angle. FIG. 2 shows a spectrum analyzer 200 and a signal generator 220, a magnetic field probe 250 measuring a magnetic field by a signal generated from signal generator 220, a magnetic field probe molder 210 molding magnetic field probe 250, a 50-ohm impedance microstrip line 230, and a microstrip line terminal 240.

As shown in FIG. 2, a microstrip line test fixture connects microstrip line 230 to a power and a signal terminal at a PCB level to detect the magnetic field emitted from all chips on the PCB. Since microstrip line 230 has a narrow width of approximately 1 mm, there are many difficulties in calibration for fabricating measurement magnetic field probe 250. An error should be calibrated depending on angles and locations of microstrip line 230 and magnetic field probe 250, however, error calibration is very difficult due to microstrip line 230 having the narrow width.

Therefore, the present disclosure suggests not the micro strip line test fixture but the circular test fixture and suggests a method for calibrating a probe characteristic by using the suggested circular test fixture.

Figure 3:
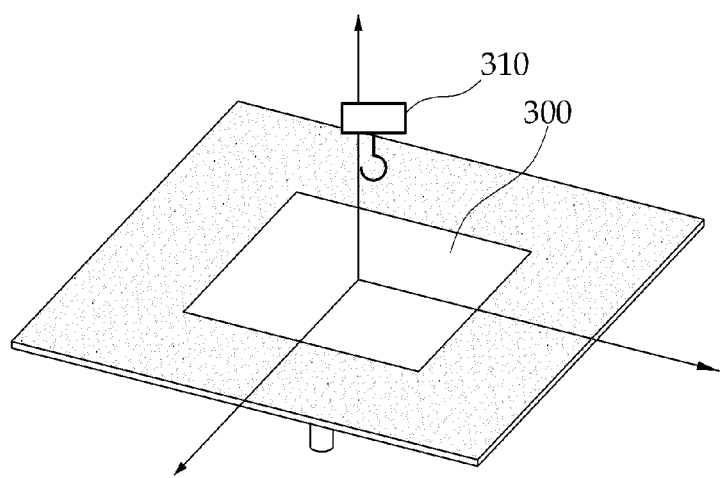
FIG. 3 is a diagram showing a plane-type test fixture according to an exemplary embodiment of the present disclosure.

FIG. 3 shows a text fixture for evaluating an antenna characteristic according to an exemplary embodiment of the present disclosure. Hereinafter, referring to FIG. 3, the text fixture for evaluating the antenna characteristic according to the exemplary embodiment of the present disclosure will be described in detail.

Referring to FIG. 3, a kind of patch antenna structure is provided as a plane type test fixture 300 instead of the existing microstrip line test fixture. Referring to FIG. 3, plane type rectangular test fixture 300 is shown. Further, FIG. 3 shows a magnetic field probe 310 measuring a magnetic field generated by plane type test fixture 300 and a spectrum analyzer (not shown) analyzing the magnetic field measured by the magnetic field probe, as shown in FIG. 2.

FIG. 3 shows rectangular test fixture 300, but the shape of test fixture 300 is not limited thereto. Text fixture 300 may have various shapes forming a test fixture having a predetermined width. That is, the test fixture 300 may include all polygonal text fixtures having various shapes such as a triangular shape and a pentagonal shape in addition to a quadrangular shape including the rectangular shape.

In the structure shown in FIG. 3, since upper metallic plane-type test fixture 300 has an equivalent potential, test fixture 300 has a characteristic that the magnetic field is constant in other parts except for a feed point. Therefore, since plane type test fixture 300 is constant in magnetic field depending on the location unlike the existing microstrip line test fixture, plane-type test fixture 300 is not limited to being dependent on the location. As described above, magnetic field probe 310 measures the magnetic field generated from the plane-type test fixture and provides the measured magnetic field to the spectrum analyzer (not shown). The spectrum analyzer (not shown) analyzes the magnetic field received from magnetic field probe 310 to extract optimal data.

However, the quadrangular plane-type test fixture has an error depending on an angle of the probe.

Figure 4:
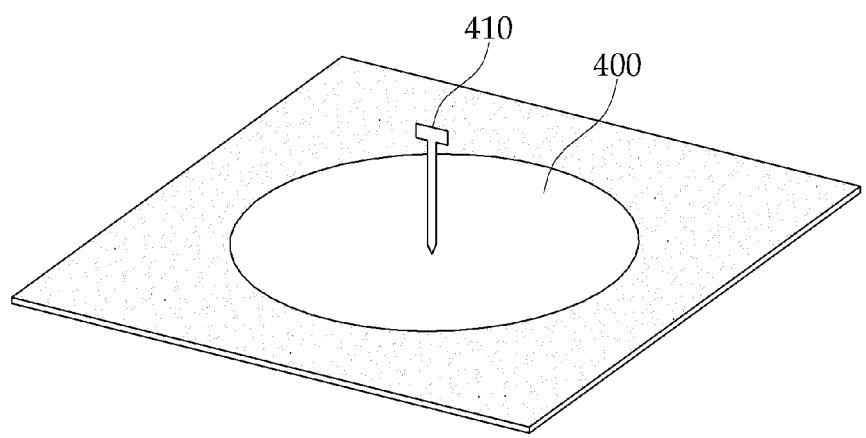
FIG. 4 is a diagram showing a circular test fixture according to an exemplary embodiment of the present disclosure.

FIG. 4 shows a text fixture for evaluating an antenna characteristic according to another exemplary embodiment of the present disclosure. Hereinafter, referring to FIG. 4, the text fixture for evaluating the antenna characteristic according to another exemplary embodiment of the present disclosure will be described in detail.

FIG. 4 shows a circular test fixture 400 instead of the existing micro strip line test fixture.

As described above, the quadrangular plane-type test fixture has the error depending on the angle of the probe, but circular test fixture 400 has no error depending on the angle, and as a result, circular test fixture 400 can be used without limitation. That is, by such a configuration, the disadvantage of the micro strip line test fixture can be solved.

FIG. 4 may also show a magnetic field probe 410 measuring a magnetic field generated from the circular text fixture and a spectrum analyzer (not shown) analyzing the magnetic field measured by the magnetic field probe similarly as FIG. 3. Magnetic field probe 410 measures the magnetic field generated from circular test fixture 400 and provides the measured magnetic field to the spectrum analyzer. The spectrum analyzer analyzes the magnetic field received from magnetic field probe 410 to extract optimal data.

Figure 5:
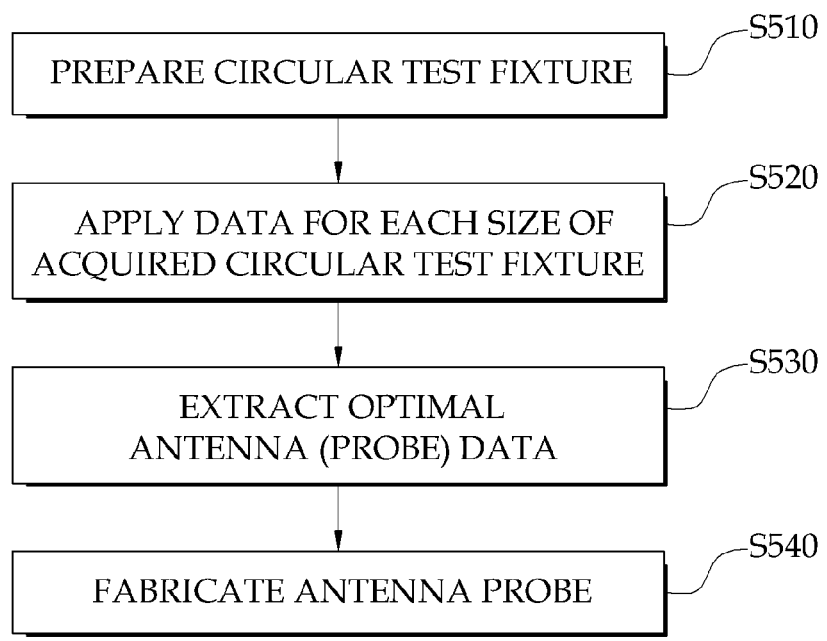
FIG. 5 is a diagram showing a process of extracting antenna data by using a circular test fixture according to an exemplary embodiment of the present disclosure.

FIG. 5 shows a process of calibrating an antenna characteristic according to an exemplary embodiment of the present disclosure. Hereinafter, referring to FIG. 5, the process of calibrating the antenna characteristic according to the exemplary embodiment of the present disclosure will be described in detail.

Referring to FIG. 5, the process of calibrating the antenna characteristic includes preparing a circular test fixture (S510), applying data for each size of the acquired circular test fixture (S520), extracting optimal antenna data (S530), and fabricating an antenna probe by using the extracted data (S540).

More specifically, in the antenna characteristic calibrating process, first, the circular test fixture is prepared (S510). Of course, optimal antenna data depending on the diameter of the circular test fixture may be acquired in advance.

A magnetic field probe (antenna) is positioned at a portion spaced apart from the surface of the circular text fixture by 1 mm in order to acquire data for near field scan. Thereafter, the magnetic field probe (antenna) is set as a first port (port-1) and the circular test fixture is set as a second port (port-2) to acquire a reflection coefficient and a transmission coefficient of each port.

In addition to the reflection coefficient and the transmission coefficient, the intensity of a spatial magnetic field (H-field) generated vertically to the surface of the circular test fixture is measured. A result of the magnetic field (H-field), which is a distribution of a conductor surface, is expressed as a unit called A/m, but in general, the result is analyzed by the spectrum analyzer and expressed as dBuV in EMC measurement. In general, the magnetic field (H-field) of the conductor surface is not shown similarly as the spatial magnetic field (H-field). In order to acquire the magnetic field (H-field) of the conductor surface, the data is acquired by analyzing not radiated emission (RE) emitted to a space but conducted emission (CE) transferred to a conductor. The acquired data of the circular test fixture is applied for each circular size (S520).

In general, the RE represents electromagnetic noise in which electromagnetic waves are emitted and transferred to the air and the CE represents electromagnetic noise transferred through a medium such as a signal line or a power line.

The measured intensity of the magnetic field is stronger at the center than at the periphery of the conductor surface because the feed point is placed at the center to apply a signal.

Through the above-mentioned process, the antenna (probe) data is extracted (S530) and since the acquired data may be used as standard data at the time of fabricating the antenna for near field scan, the data are useful for EMC measurement. That is, through the method, a standard antenna for near field scan is fabricated (S540).

In FIG. 5, the process of extracting the near field scan antenna data by using the circular test fixture is shown, but the present disclosure is not limited thereto. That is, a process of extracting the near field scan antenna data by using the plane-type quadrangular text fixture shown in FIG. 3 may also be performed similarly as the method described in FIG. 5.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for near field scan calibration, comprising:
   a plane-type test fixture having a plane shape;
   an antenna spaced apart from the plane-type test fixture by a set spacing distance and acquiring data including a magnetic field; and
   a spectrum analyzer analyzing the data acquired by the antenna,
   wherein the plane-type test fixture has a circular shape.

2. The apparatus of claim 1, wherein the spacing distance between the plane-type test fixture and the antenna is 1 mm.

3. The apparatus of claim 2, wherein the antenna is set as a first port and the plane-type test fixture is set as a second port.

4. The apparatus of claim 3, wherein the data acquired by the antenna includes the intensity of a spatial magnetic field generated vertically to the surface of the plane-type test fixture including a transmission coefficient and a reflection coefficient.

5. The apparatus of claim 4, wherein the magnetic field is acquired by analyzing conducted emission (CE) transferred to a conductor.

6. The apparatus of claim 1, wherein the plane-type test fixture is made of metal.

7. A method for near field scan calibration, comprising:
   feeding power to a center of a plane-type test fixture;
   acquiring data including a magnetic field from an antenna for near field scan measurement spaced apart from the plane-type test fixture by a set spacing distance; and
   extracting a characteristic of the antenna by using the data,
   wherein the plane-type test fixture has a circular shape.

8. The method of claim 7, further comprising feeding the power in an amount corresponding to a size of the plane-type test fixture.

9. The method of claim 7, wherein the spacing distance between the plane-type test fixture and the antenna is 1 mm.

10. The method of claim 9, wherein the antenna is set as a first port and the plane-type test fixture is set as a second port.

11. The method of claim 10, wherein in the acquiring of the data, the intensity of a spatial magnetic field generated vertically to the surface of the plane-type test fixture including a transmission coefficient and a reflection coefficient is acquired.

12. The method of claim 11, wherein the magnetic field is acquired by analyzing conducted emission (CE) transferred to a conductor.

* * * * *